(12) United States Patent
Hashimoto et al.

(10) Patent No.: US 11,581,052 B2
(45) Date of Patent: Feb. 14, 2023

(54) MEMORY SYSTEM AND METHOD

(71) Applicant: Kioxia Corporation, Tokyo (JP)

(72) Inventors: Akiyoshi Hashimoto, Yokohama (JP);
Makoto Kuribara, Yokohama (JP);
Takeshi Tomizawa, Yokohama (JP);
Katsuhiko Ueki, Katsushika (JP)

(73) Assignee: Kioxia Corporation, Tokyo (JP)

(*) Notice: Subject to any disclaimer, the term of this patent is extended or adjusted under 35 U.S.C. 154(b) by 127 days.

(21) Appl. No.: 17/010,914

(22) Filed: Sep. 3, 2020

(65) Prior Publication Data
US 2021/0295937 A1    Sep. 23, 2021

(30) Foreign Application Priority Data
Mar. 19, 2020    (JP) ............................ JP2020-050122

(51) Int. Cl.
| G11C 29/02 | (2006.01) |
| G11C 16/16 | (2006.01) |
| G11C 16/26 | (2006.01) |
| G11C 16/34 | (2006.01) |
| G11C 11/56 | (2006.01) |
| G11C 16/08 | (2006.01) |
| G11C 29/00 | (2006.01) |

(52) U.S. Cl.
CPC ........ *G11C 29/025* (2013.01); *G11C 11/5635* (2013.01); *G11C 11/5642* (2013.01); *G11C 16/08* (2013.01); *G11C 16/16* (2013.01); *G11C 16/26* (2013.01); *G11C 16/349* (2013.01)

(58) Field of Classification Search
CPC .............. G11C 29/025; G11C 11/5635; G11C 11/5642; G11C 16/08; G11C 16/16
See application file for complete search history.

(56) References Cited

U.S. PATENT DOCUMENTS

| | | | | |
|---|---|---|---|---|
| 6,496,411 | B2 * | 12/2002 | Yamada | G11C 11/5642 365/185.24 |
| 8,321,760 | B2 * | 11/2012 | Son | G06F 11/1072 714/763 |
| 8,990,665 | B1 * | 3/2015 | Steiner | G11C 16/26 714/780 |
| 9,189,313 | B2 * | 11/2015 | Matsuyama | G11C 16/3422 |
| 9,489,257 | B2 * | 11/2016 | Ish-Shalom | H03M 13/6325 |
| 9,502,129 | B1 * | 11/2016 | Suzuki | G06F 3/0679 |
| 10,163,511 | B2 * | 12/2018 | Nam | G11C 11/4099 |
| 11,094,377 | B2 * | 8/2021 | Redaelli | G11C 13/004 |

(Continued)

*Primary Examiner* — Esaw T Abraham
(74) *Attorney, Agent, or Firm* — Oblon, McClelland, Maier & Neustadt, L.L.P.

(57) ABSTRACT

According to one embodiment, a memory system includes a non-volatile memory and a controller. The memory includes a plurality of storage areas. Each of the storage areas includes a plurality of memory cells to which threshold voltages are set in accordance with data. The controller acquires a first threshold voltage distribution of memory cells in a first storage area of the storage areas. The controller acquires a second threshold voltage distribution of memory cells in a second storage area of the storage areas. The controller detects non-normalcy in the first storage area or the second storage area from a first divergence quantity between the first threshold voltage distribution and the second threshold voltage distribution.

20 Claims, 11 Drawing Sheets

(56) References Cited

U.S. PATENT DOCUMENTS

| | | | |
|---|---|---|---|
| 2014/0059396 A1* | 2/2014 | Matsuyama | G06F 11/0751 |
| | | | 714/54 |
| 2015/0049549 A1 | 2/2015 | Asaoka | |
| 2015/0106667 A1* | 4/2015 | Zeng | G11C 16/3459 |
| | | | 714/704 |
| 2015/0199138 A1 | 7/2015 | Ramachandran et al. | |
| 2019/0304563 A1 | 10/2019 | Her et al. | |

* cited by examiner

FIG.8
BLOCK GROUP #0 (310)
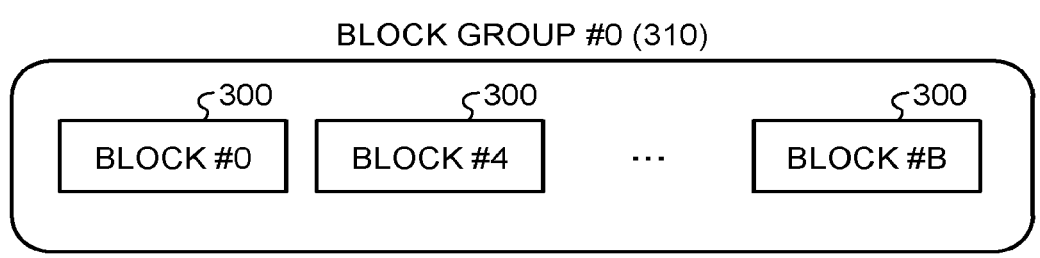
BLOCK GROUP #1 (310)
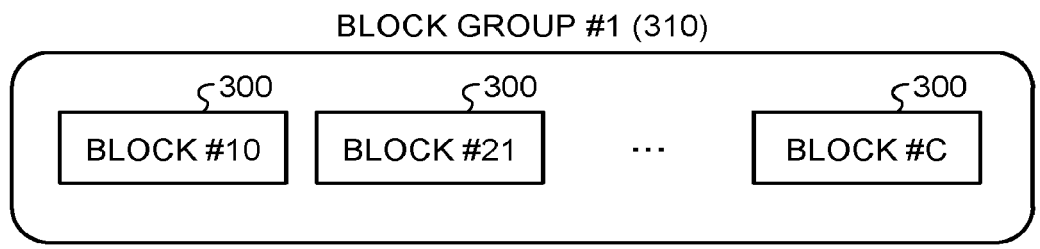

MEMORY SYSTEM AND METHOD

CROSS-REFERENCE TO RELATED APPLICATIONS

This application is based upon and claims the benefit of priority from Japanese Patent Application No. 2020-050122, filed on Mar. 19, 2020; the entire contents of which are incorporated herein by reference.

FIELD

Embodiments described herein relate generally to a memory system and a method.

BACKGROUND

Memory systems including non-volatile memories such as the NAND flash memories have been known. The NAND flash memory may exhibit defect or failure in characteristics related to the word lines. Conventionally, such defect or failure has been regarded as an event to an unknown cause that a large number of uncorrectable defects of read data has occurred. That is, it takes a long period of time and a large amount of effort to detect and/or analyze such event.

In spite of occurrence of such event in a word line, access to the defective word line is permitted and executed during a period from occurrence of the defect to detection and/or analysis of the detect. Upon every access to the word line in response to a request from a host, a higher degree of error correction is executed, which leads to deteriorating responsiveness of the memory system.

BRIEF DESCRIPTION OF THE DRAWINGS

FIG. 8 is a conceptual diagram illustrating one or more block groups generated by a series of operations illustrated in FIG. 7;

DETAILED DESCRIPTION

According to an embodiment, in general, a memory system includes a non-volatile memory and a controller. The memory includes a plurality of storage areas. Each of the storage areas includes a plurality of memory cells to which threshold voltages are set in accordance with data. The controller acquires a first threshold voltage distribution of memory cells in a first storage area of the storage areas. The controller acquires a second threshold voltage distribution of memory cells in a second storage area of the storage areas. The controller detects non-normalcy in the first storage area or the second storage area from a first divergence quantity between the first threshold voltage distribution and the second threshold voltage distribution.

A memory system and a method according to an embodiment will be explained below in detail with reference to the accompanying drawings. The following embodiments are presented for illustrative purpose only and unintended to limit the scope of the present invention.

Embodiment

Figure 1:
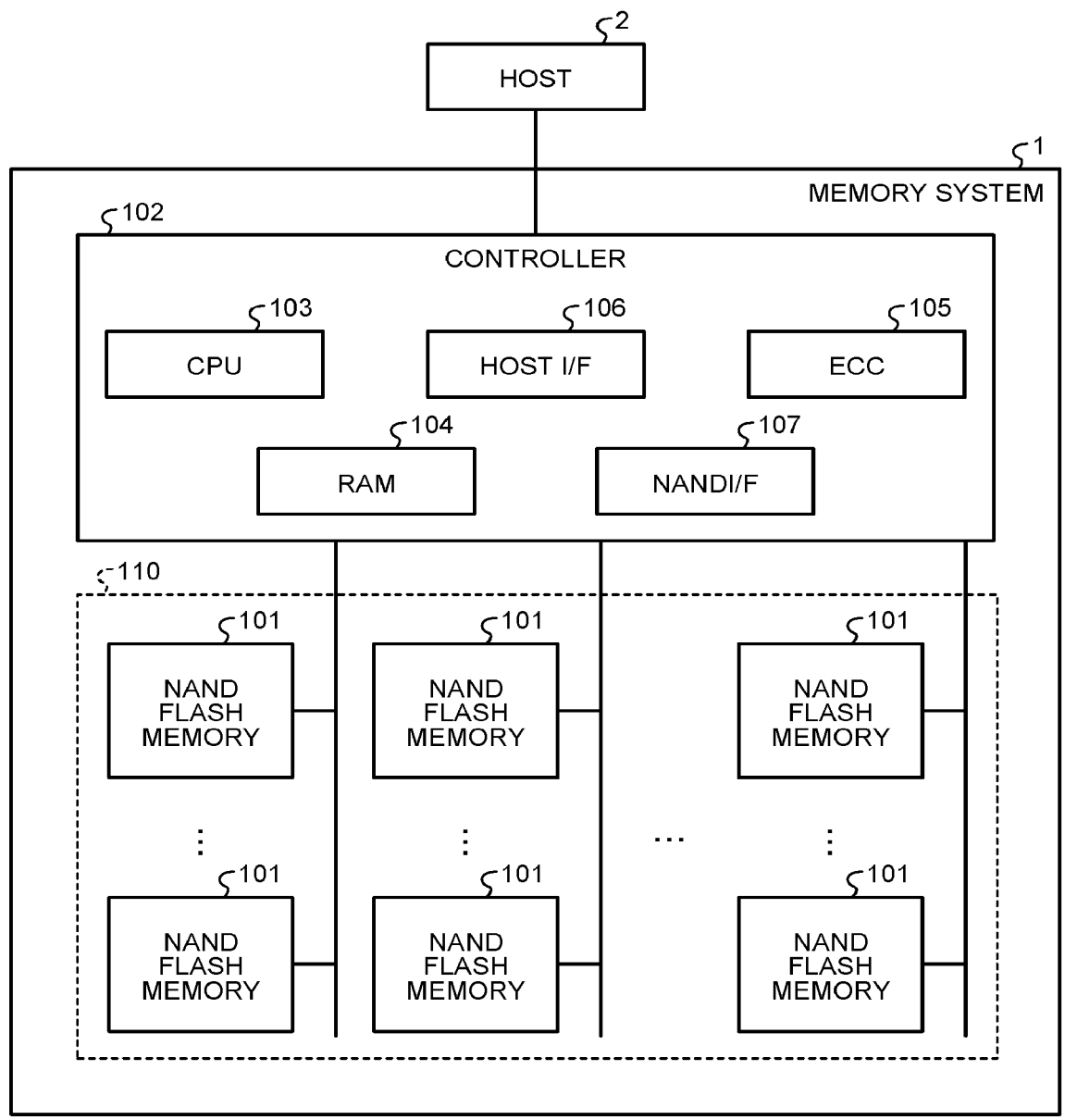
FIG. 1 is a schematic diagram illustrating an exemplary configuration of a memory system according to an embodiment.

FIG. 1 is a schematic diagram illustrating an exemplary configuration of a memory system 1 according to an embodiment. The memory system 1 is connected to a host 2 via a given communication interface. The host 2 represents a processor incorporated in, for example, a personal computer, a personal digital assistant, or a server. The host 2 uses the memory system 1 as an external storage.

The memory system 1 receives access requests, i.e., read request and write request, from the host 2. The memory system 1 reads target data in response to a read request and transmits the read data to the host. The memory system 1 receives and writes target data in response to a write request.

The memory system 1 includes one or more NAND flash memories (hereinafter, also referred to as NAND memories) 101 and a controller 102. The one or more NAND memories 101 are exemplary non-volatile memories.

In the example illustrated in FIG. 1, the controller 102 includes a plurality of channels. The channels are each connected to a given number of NAND memories 101. The connection between the controller 102 and the respective NAND memories 101 is not limited to this example.

A group of NAND memories 101 functions as a plurality of storage areas. That is, one or more NAND memories 101 serve as a storage area. The controller 102 controls transferring of data between the host 2 and the group of NAND memories 101. The group of NAND memories 101 is referred to as a NAND storage 110.

The controller 102 includes a central processing unit (CPU) 103, a random access memory (RAM) 104, an error-correcting code (ECC) circuit 105, a host interface (I/F) 106, and a NAND I/F 107.

The CPU 103 represents a processor that implements various functions of the controller 102 by a firmware program.

The RAM 104 is a volatile memory that can compute at higher speed than each of the NAND memories 101. The RAM 104 includes an area to which a firmware program is loaded, a buffer or cache area for data to transfer between the host 2 and the NAND storage 110, and a buffer or cache area for various management information.

The ECC circuit 105 encodes data to be transmitted to the NAND storage 110 for error correction. The ECC circuit 105 decodes data read from the NAND storage 110 (hereinafter, referred to as read data) to detect and correct error in the read data.

The ECC circuit 105 may encode data by different methods having different error correcting capabilities. For example, the ECC circuit 105 decodes read data by a method with a lowest error correcting capability. If failing to correct error in the read data by the method concerned, the ECC circuit 105 decodes the read data by a method with a higher error correcting capability.

The CPU 103 may execute data encoding and/or decoding. The CPU 103 may partially or entirely execute data encoding and decoding by different methods.

The host I/F 106 controls communication between the host 2 and the memory system 1.

The NAND I/F 107 controls communication between the controller 102 and the respective NAND memories 101.

The controller 102 may include hardware circuitry such as a micro processing unit (MPU), a graphic processing unit (GPU), a field-programmable gate array (FPGA), or an application specific integrated circuit (ASIC), in place of the CPU 103 or in addition to the CPU 103. Such hardware circuitry may implement the functions of a processor.

Figure 2:
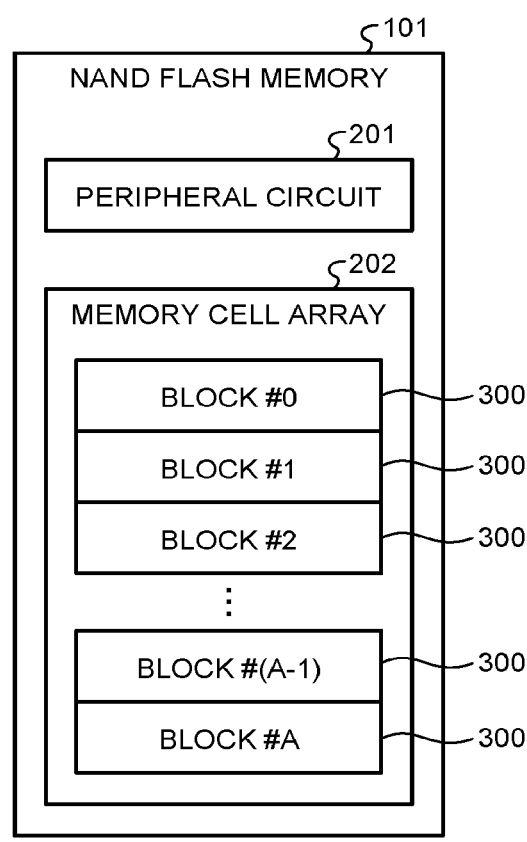
FIG. 2 is a schematic diagram illustrating an exemplary configuration of a NAND flash memory.

FIG. 2 is a schematic diagram illustrating an exemplary configuration of the NAND memory 101. Each NAND memory 101 includes a peripheral circuit 201 and a memory cell array 202.

The peripheral circuit 201 includes a row decoder, a column decoder, a sense amplifier, a voltage generation circuit, a sequencer, and a data buffer. The peripheral circuit 201 can execute a data program operation, i.e., writing, a data sensing operation, i.e., reading, and a data erase operation to the memory cell array 202.

The memory cell array 202 includes a plurality of memory cell transistors in two-dimensional or three-dimensional arrangement. The memory cell array 202 includes a plurality of blocks 300. FIG. 2 illustrates an A+1 blocks 300 where A is an integer of four or more. Each of the blocks 300 serves as a unit of erase to the memory cell array 202. That is, all the data stored in one block 300 is collectively erased by an erase operation. Hereinafter, the memory cell transistors will be referred to as memory cells.

Figure 3:
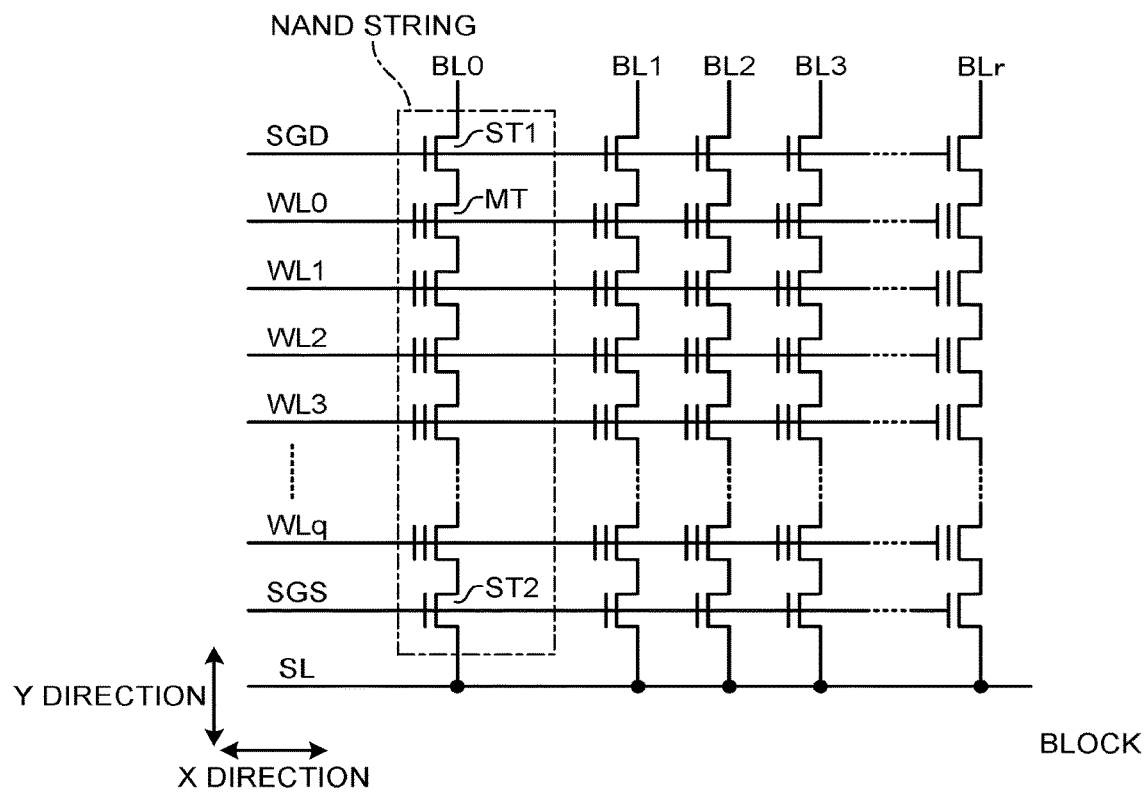
FIG. 3 is a circuit diagram illustrating an exemplary configuration of one block of an embodiment.

FIG. 3 is a circuit diagram illustrating an exemplary configuration of one block of an embodiment. FIG. 3 depicts a block including two-dimensionally arranged memory cells as an example.

As illustrated in FIG. 3, each block includes (r+1 where r≥0) NAND strings arrayed in an X direction. Each of the (r+1) NAND strings includes a selection transistor ST1 with drains connected to bit lines BL0 to BLr and gates commonly connected to a select gate line SGD, and a selection transistor ST2 with sources commonly connected to a source line SL and gates commonly connected to a selection gate line SGS.

Each memory cell MT includes a metal oxide semiconductor field effect transistor (MOSFET) having a laminated gate structure on a semiconductor substrate. The laminated gate structure includes a floating gate to a semiconductor substrate with a tunnel oxide film intervening therebetween, and a control gate electrode to the floating gate with an inter-gate insulating film intervening therebetween. A threshold voltage varies according to the number of electrons accumulated at the floating gate. The memory cell MT stores data in accordance with a difference in threshold voltage. That is, the memory cell MT stores, in the floating gate, an amount of charge corresponding to data.

In each NAND string, q+1 (where q≥0) memory cells MT are arranged such that their current paths are connected in series between the source of the selection transistor ST1 and the drain of the selection transistor ST2. The control gate electrodes are connected to the corresponding word lines WL0 to WLq in order from the memory cell MT closest to the selection transistor ST1. That is, the drain of the memory cell MT connected to the word line WL0 is connected to the source of the selection transistor ST1, and the source of the memory cell MT connected to the word line WLq is connected to the drain of the selection transistor ST2.

The word lines WL0 to WLq are commonly connected to the control gate electrodes of the memory cells MT between the respective NAND strings in the block. That is, the control gate electrodes of the memory cells MT in the same row in the block are connected to the same word line WL. In a case of each memory cell MT storable of a 1-bit value, (r+1) memory cells MT connected to the same word line WL are handled as one page. The program operation and the read operation are performed on a page basis.

Each memory cell MT may store 2-bit or more bit data. As for the memory cells MT, each of which can store n-bit (n≥2) data, for example, the storage capacity per word line is equal to a size of n-pages.

The number of bits of data stored in each memory cell MT is not limited to a particular number. Herein, a triple level cell (TLC) method is adopted by way of example. By TLC, each memory cell MT stores 3-bit data.

Figure 4:
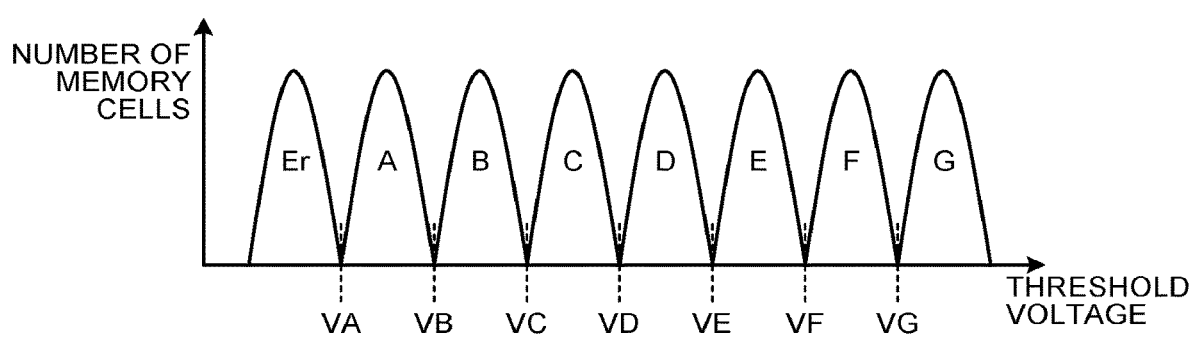
FIG. 4 is a diagram illustrating a distribution of possible threshold voltages of a memory cell according to an embodiment.

FIG. 4 is a diagram illustrating a possible threshold voltage distribution of the memory cells MT according to an embodiment. In FIG. 4, a horizontal axis represents the threshold voltage and a vertical axis represents the number of memory cells. The threshold voltage distribution will be referred to as a Vth distribution.

In writing data to the memory cell MT, the threshold voltage of the memory cell MT is controlled to be included in one of eight states of, state Er, state A, state B, state C, state D, state E, state F, and state G. The states Er and A to G are associated with different 3-bit data items one by one. As a result, each memory cell MT can store 3-bit data.

The state Er corresponds to a data erased state of the memory cell MT. That is, the threshold voltage of the memory cell MT, after subjected to the erase operation by the peripheral circuit 201, is included in the state Er. The peripheral circuit 201 executes a program operation to maintain the threshold voltage of the memory cell MT in the state Er or raise it to one of the states A to G corresponding to the state of the data. That is, the threshold voltage of each memory cell MT is set in accordance with the data. The threshold voltage distribution includes eight lobes corresponding to the different states.

A determination voltage for read operation is set between two adjacent states. As illustrated in FIG. 4, for example, a determination voltage VA is set between the state Er and the state A, a determination voltage VB is set between the state A and the state B, a determination voltage VC is set between the state B and the state C, a determination voltage VD is set between the state C and the state D, a determination voltage VE is set between the state D and the state E, a determination voltage VF is set between the state E and the state F, and a determination voltage VG is set between the state F and the state G.

In the read operation, the peripheral circuit 201 determines the state of the threshold voltage of each memory cell MT through comparison between the threshold voltage and the determination voltages VA to VG. The peripheral circuit 201 decodes the determined state into data having a value corresponding to the state, and transmits the decoded data to the controller 102.

To perform a read operation to a particular bit of the 3-bit data, the peripheral circuit 201 may determine the particular bit data using part of the determination voltages VA to VG. That is, the peripheral circuit 201 can determine the data stored in the memory cell MT using part or all of the determination voltages VA to VG.

The memory cells MT may be worn out through repetitions of use, so that the threshold voltages of the memory cells MT may vary.

For example, to perform a read operation to a word line, in the block including the memory cells MT connected to the word line concerned, all the memory cells MT connected to the other word lines are to be placed in a conductive state. For this purpose, the other word lines are applied with a sufficiently high voltage Vread higher than the determination voltage VG. Applied with the voltage Vread through the other word lines, the threshold voltages of the memory cells MT connected to the other word lines may vary to higher voltages. That is, upon every read operation to a certain block 300, the threshold voltages of the memory cells MT included in the block 300 vary to higher voltages. This phenomenon is known as read disturb.

Further, it is known that after the program operation, the threshold voltages of the memory cells MT vary to lower voltages with time. The elapsed time after the program operation will be referred to as a data retention (DR) time.

It is also known that when through repeated executions of both the program operation and the erase operation, that is, a program erase cycle, the memory cells MT deteriorate and are thus likely to vary in threshold voltage.

Hereinafter, the degree or frequency of usage of the memory cells MT will be referred to as a degree of wear-out signifying that the memory cell MT is worn out by use.

If the Vth distribution partially or entirely exceeds the determination voltage set in the boundary between the states, an error occurs, such as reading data different from written data. The ECC circuit 105 attempts to correct the error, for example.

Data, if read from a certain word line with a defect, includes a large amount of errors. In this case, the data is subjected to various types of decoding until data with no error is read. The defect in the word line signifies, for example, that the characteristics of the word line become defective.

Typically, the higher the error correcting capability the method has, the longer the time taken for decoding is. Processing a data read request for the defective word line requires decoding with higher error correcting capability, which elongates the total time taken for processing the read request. That is, the memory system 1 deteriorates in responsiveness.

In the embodiment, the controller 102 detects a block including the memory cells connected to a defective word line irrespective of the read request. For example, the controller 102 detects the block in the background. After detection of the block including the defective word line, the controller 102 registers the block as a defective block. The defective block refers to a non-normal block unsuitable for use. The controller 102 prohibits use of the defective block. Before accessing to the defective word line in response to a request from the host 2, the controller 102 sets the block including the memory cells connected to the defective word line as a defective block. This can prevent the memory system from deteriorating in responsiveness, which would otherwise occur due to the access to the defective word line.

The controller 102 detects the block including the defective word line, as follows.

For example, two blocks having the same degree of wear-out are considered to exhibit similar Vth distributions. However, with a defect in the word line of one of the two blocks, the memory cells connected to the word line concerned will exhibit a completely different Vth distribution from the ones at the time of no defect in the word line.

In view of this, the controller 102 acquires the Vth distributions of the memory cells MT included in the two blocks having the same degree of wear-out, to detect a block including the memory cells connected to the defective word line, depending on similarity or non-similarity between the acquired two Vth distributions.

The controller 102 determines the similarity between two Vth distributions by comparing a divergence quantity between the two Vth distributions and a threshold. In the embodiment, as an example, a divergence quantity is set to a Kullback-Leibler (KL) divergence.

Using the KL divergence as the divergence quantity, divergence quantity $D(P\|Q)$ between a probability distribution $P(X)$ and a probability distribution $Q(X)$ is defined by the following Equation (1):

$$D(P\|Q) = \sum_x P(x)\log\frac{P(x)}{Q(x)} \tag{1}$$

where X represents a random variable and x represents an observed value.

According to Equation (1), the KL divergence is calculated as zero when $P(X)=Q(X)$ holds, Thus, the KL divergence can be considered to represent the degree of divergence between $P(X)$ and $Q(X)$.

By substituting one of the two Vth distributions into $P(X)$ and substituting the other of the two Vth distributions into $Q(X)$ in Equation (1), it is possible to find a scalar quantity, that is, divergence quantity representing the quantified degree of divergence of the two Vth distributions.

The Vth distributions may differ depending on a relative position of the word lines within a block 300. That is, two Vth distributions, acquired from the word lines located at different relative positions in the blocks 300, may not be similar to each other even if the blocks 300 have the same degree of wear-out.

Thus, word line pairs located at the same relative position in different blocks 300 are subject to acquisition of the Vth distributions for comparison.

Figure 5A:
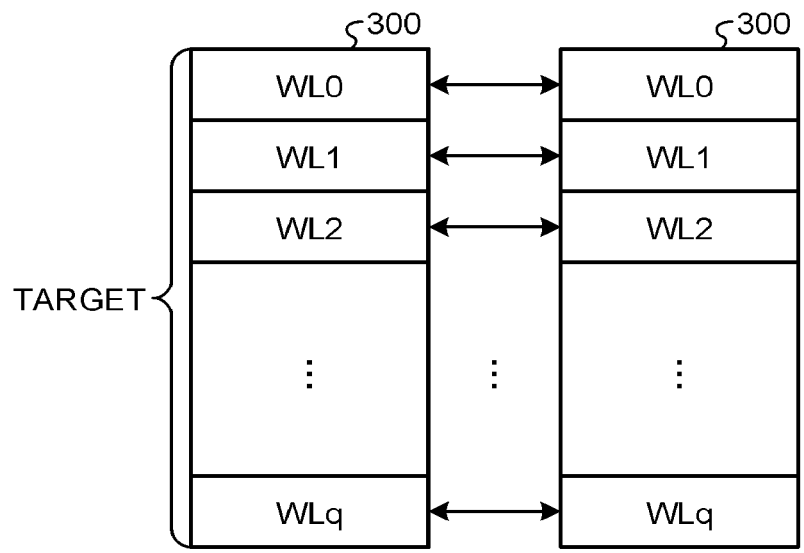
FIGS. 5A to 5C are diagrams illustrating an exemplary method for selecting a word line.
Figure 5B:
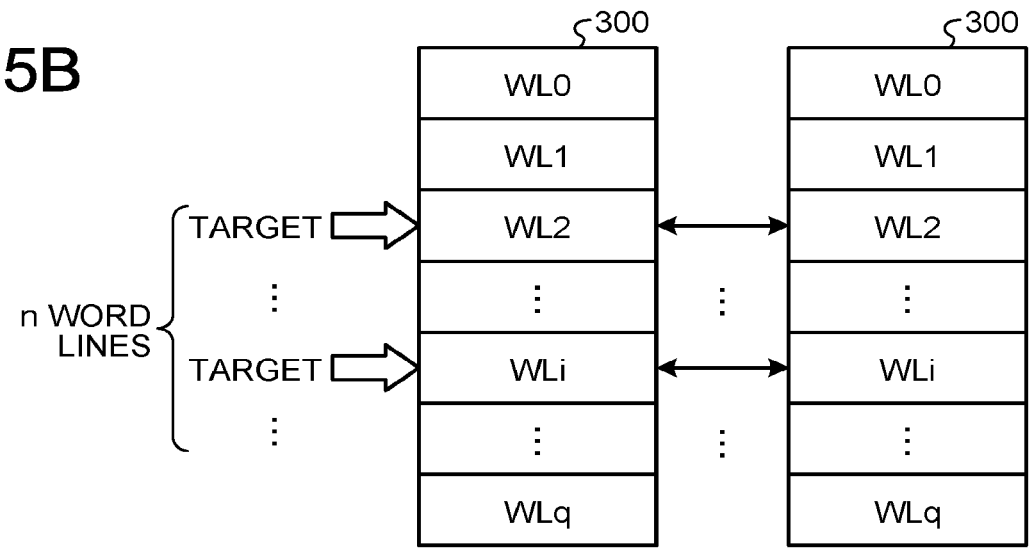
Figure 5C:
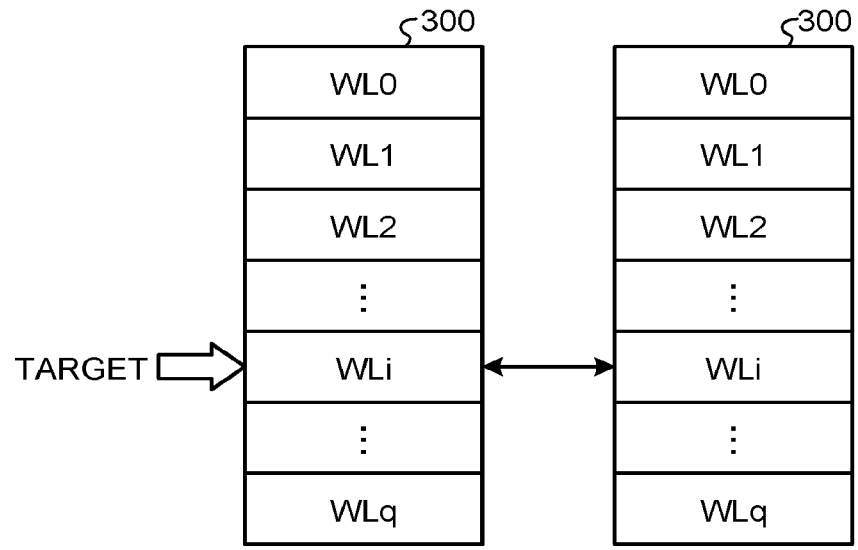

The word lines may be optionally selected to be a subject of the acquisition of the Vth distribution. FIGS. 5A to 5C are diagrams illustrating an exemplary method for selecting word lines.

For example, as illustrated in FIG. 5A, all the word line pairs WL0 to Wq may be subjected to acquisition of the Vth distribution. For example, each block 300 includes (q+1) word lines. The word lines of each block 300 are assigned with numbers zero to q indicating relative positions from head word lines assigned with the number zero. This number is referred to as a word line number. In the example illustrated in FIG. 5A, (q+1) word lines pairs assigned with the same word line number are set between the two blocks 300. The controller 102 determines whether the Vth distributions of each of the (q+1) pairs are similar. If there is a pair determined to have non-similar Vth distributions, a defect in one of the word line pair may be inferred.

In another example, as illustrated in FIG. 5B, the controller may select two or more word lines from all the word lines to determine whether or not the Vth distributions of each selected pair are similar. In FIG. 5B, n-pairs with consecutive word line numbers are selected from the (q+1) pairs. Alternatively, n-pairs with discontinuous word line numbers may be selected where n is an integer of 1 or more and q or less. Decreasing the number of targets for acquiring the Vth distribution can shorten the amount of processing time required.

The number n may be determined by any method. For example, the ideal number n0 of samples can be expressed by the following Equation (2):

$$n0 = -\frac{\ln(1 - L_c)}{p} + \frac{\ln\left(\sum_{k=0}^{N}\frac{(n0p)^k}{k!}\right)}{p} \quad (2)$$

where p represents a maximum value of the KL divergence with no defect in the word lines, Lc represents a confidence interval, and N represents the allowable number of defective word lines.

To detect the block 300 including the defective word line, the following Equation (3) is derived by substituting zero into N in Equation (2):

$$n0 = -\frac{\ln(1 - L_c)}{p}. \quad (3)$$

The number n can be set to the ideal number n0 of samples found by Equation (3). Setting the number n to n0 makes it possible to find a reliable result of detection according to the set confidence interval Lc.

As illustrated in FIG. 5C, the number n can be set to one. This lowers the reliability of the result of detection, however, it is still possible to detect a defect in the selected pair of word lines, if any.

Figure 6:
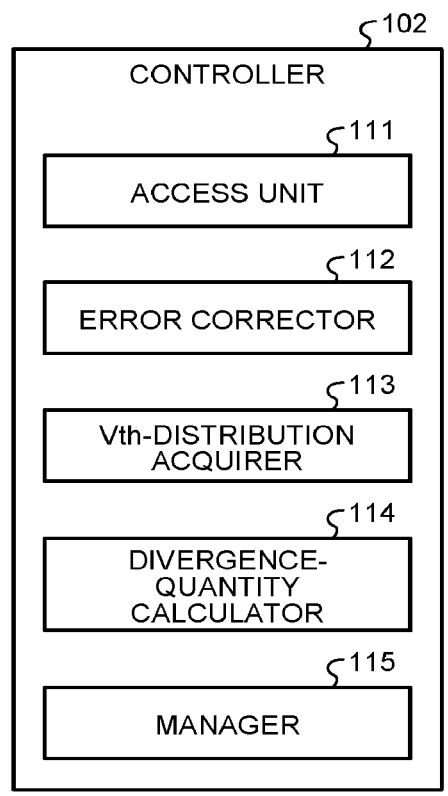
FIG. 6 is a schematic diagram illustrating an exemplary functional configuration of a controller according to an embodiment.

FIG. 6 is a schematic diagram illustrating an exemplary functional configuration of the controller 102 according to an embodiment. The controller 102 includes an access unit 111, an error corrector 112, a Vth-distribution acquirer 113, a divergence-quantity calculator 114, and a manager 115. The respective functions of the access unit 111, the Vth-distribution acquirer 113, the divergence-quantity calculator 114, and the manager 115 are implemented by the CPU 103's executing a firmware program, for example. In addition, the ECC circuit 105 may implement the error corrector 112, for example. The CPU 103 or both the CPU 103 and the ECC circuit 105 may implement the error corrector 112.

The access unit 111 serves to analyze access requests from the host 2 and allow access to the NAND storage 110 by controlling the NAND I/F 107 according to a result of the analysis.

The error corrector 112 serves to correct error in read data from the NAND storage 110 by one or more methods.

The manager 115 serves to execute various processes to the NAND storage 110 such as managing the degree of wear-out of the NAND storage 110, detecting a block including a defective word line, and managing the defective block. The processes executed by the manager 115 in the embodiment will be described later.

The manager 115 executes processes such as management of correspondence between a logical address and a physical address, wear leveling control, garbage collection control, and refresh control, in addition to the above processes.

The Vth-distribution acquirer 113 serves to acquire the Vth distribution of the NAND storage 110.

As one example, the Vth-distribution acquirer 113 performs distribution read to the NAND memory 101 as a target of the acquisition of the Vth distribution. The distribution read refers to measuring threshold voltage distributions by counting the number of on-state memory cells or off-state memory cells connected to the word lines while shifting the voltage value applied to the word lines by given increments or decrements. The Vth-distribution acquirer 113 may shift the applied voltage to the word lines by sequentially transmitting, to the NAND memory 101, commands for setting the applied voltage to the word lines. The Vth-distribution acquirer 113 may cause the NAND memory 101 to shift the applied voltage to the word lines by transmitting a command to the NAND memory 101. Alternatively, the NAND memory 101 may automatically shift the applied voltage to the word lines. The method of acquiring the Vth distribution is not limited to these examples.

The divergence-quantity calculator 114 serves to compute the KL divergence as the divergence quantity between the Vth distributions acquired by the Vth-distribution acquirer 113.

Next, the operation of the memory system 1 according to the embodiment will be described.

Figure 7:
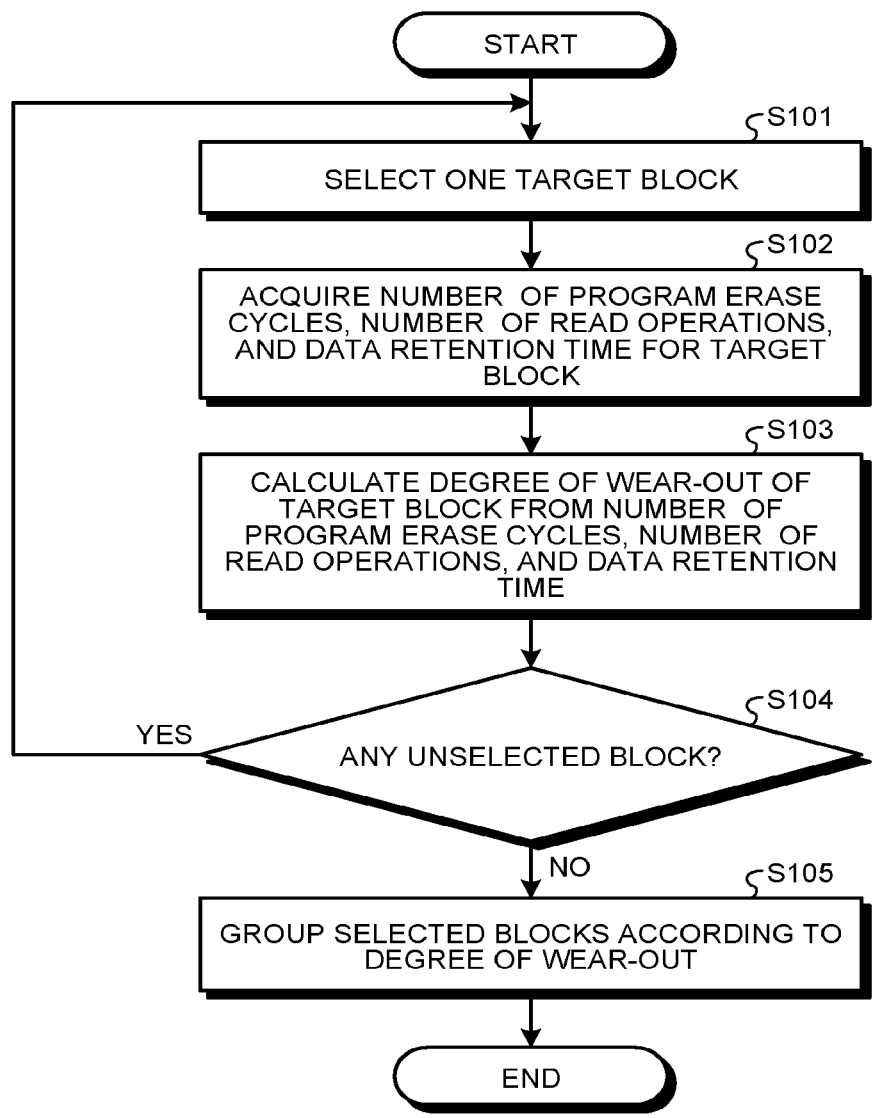
FIG. 7 is a flowchart illustrating an exemplary managing operation of a degree of wear-out by a manager according to an embodiment.

FIG. 7 is a flowchart illustrating an exemplary operation by the manager 115 to manage the degree of wear-out in the embodiment.

The manager 115 selects one of the blocks included in the NAND storage 110 as a target block (S101). At this point the manager 115 selects no defective block.

Subsequently, the manager 115 acquires the number of program erase (P/E) cycles, the number of read operations, and the data retention time for the target block (S102). The manager 115 counts and records the number of program erase cycles, the number of read operations, and the data retention time for each block as management information. In S102, the manager 115 can acquire these items of information, referring to the management information. In S102, the manager 115 may acquire any of the number of program erase cycles, the number of read operations, and the data retention time.

The number of read operations refers to the number of read operations executed to the target block after the previous program operation. The data retention time refers to a length of elapsed time from the previous program operation to the target block.

Subsequently, the manager 115 computes the degree of wear-out of the target block from the number of program erase cycles, the number of read operations, and the data retention time of the target block (S103).

The computation of the degree of wear-out is not limited to a particular method. As one example, the manager 115 computes the weighted addition of the number of program erases, the number of read operations, and the data retention time, and regards the value found by the computation as the degree of wear-out.

The computation of the degree of wear-out may include various computations such as multiplication, division, and subtraction in addition to weighted addition.

The manager 115 determines whether or not there are unselected blocks (S104). After unselected blocks are found (Yes in S104), the manager 115 returns to S101, and selects one block from the unselected blocks again.

After finding no unselected blocks (No in S104), the manager 115 sorts all the selected blocks into one or more block groups in accordance with the degree of wear-out (S105). In S105, the manager 115 classifies the blocks 300 having similar degrees of wear-out into the same block group.

The manager 115 sets, for example, the ranges of degrees of wear-out, and associates different block groups with the ranges. The manager 115 classifies the blocks 300 into a group in association with the range including the degrees of wear-out of the blocks. The grouping method is not limited to this example.

After S105, the manager 115 ends the managing operation of the degree of wear-out.

FIG. 8 is a conceptual diagram illustrating one or more block groups generated through the series of operations illustrated in FIG. 7. In the example of FIG. 8, multiple block groups 310 are generated. The numbers of blocks 300 of the block groups 310 may differ from one another. The degrees of wear-out of all the blocks 300 of the same block group 310 are similar to each other.

The timing at which the manager 115 executes the managing operation of the degree of wear-out illustrated in FIG. 7 is not limited to particular timing. In an idle state of the memory system 1, for example, the manager 115 may execute the managing operation of the degree of wear-out. Alternatively, the manager 115 may execute the managing operation of the degree of wear-out every time the access unit 111 executes a given number of read requests and/or write requests. Alternatively, the manager 115 may execute the managing operation of the degree of wear-out at a preset cycle of time such as once a day.

Figure 9:
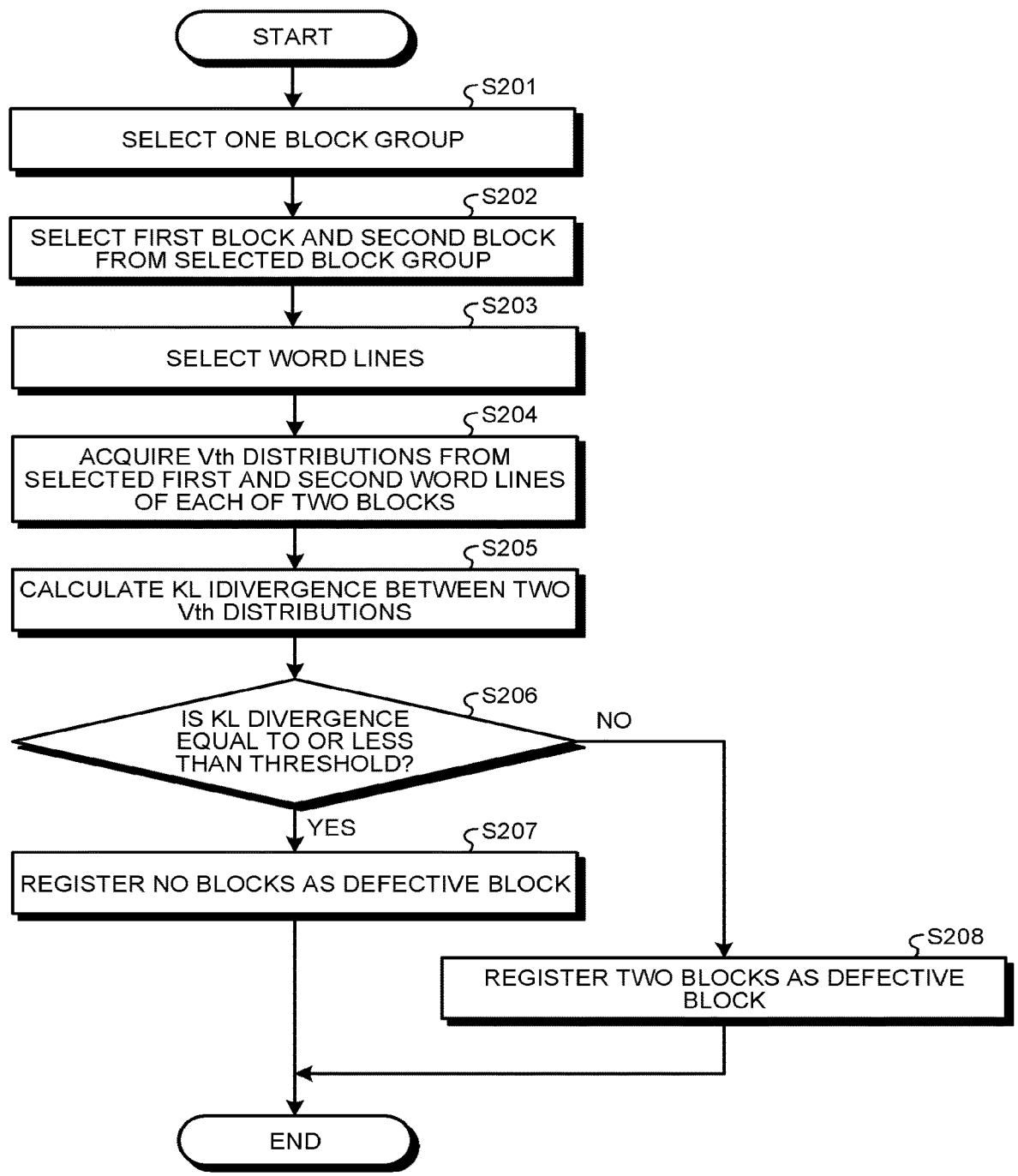
FIG. 9 is a flowchart illustrating an exemplary detecting operation to a block including a defective word line according to an embodiment.

FIG. 9 is a flowchart illustrating an exemplary detecting operation of a block including a defective word line according to an embodiment.

First, the manager 115 selects one block group 310 from one or more block groups 310 (S201). The manager 115 selects two blocks 300 from the selected block group 310 (S202). One of the two blocks 300 is referred to as a first block 300, and the other of the two blocks 300 is referred to as a second block 300.

Next, the manager 115 selects word lines (S203). Specifically, the manager 115 selects the word line numbers as a subject of the acquisition of the Vth distribution.

As described with reference to FIGS. 5A to 5C, the manager 115 may select all the word lines in the block 300 or the number of word lines set according to the confidence interval. Alternatively, the manager 115 may select one word line. For the sake of simplicity, the manager 115 selects one word line in FIG. 9.

After S203, the Vth-distribution acquirer 113 acquires the Vth distributions of a first word line indicated by the selected word line number in the first block 300, and a second word line indicated by the selected word line number in the second block 300 (S204).

The divergence-quantity calculator 114 computes the KL divergence between the two Vth distributions acquired (8205).

The manager 115 determines whether or not the KL divergence is equal to or less than a given threshold (S206).

From the KL divergence being the threshold or less, no defect in the first word line and the second word line is inferred (Yes in S206). In this case, the manager 115 refrains from registering either the first block 300 or the second block 300 as a defective block (S207). The manager 115 ends the detecting operation of the block including a defective word line.

From the KL divergence being more than the threshold, defect in either the first word line or the second word line is inferred (No in S206). In such a case, the manager 115 registers both of the two target blocks 300 as defective blocks (S208). Then, the manager 115 ends the detecting operation of the block including a defective word line.

In the example of FIG. 9, a negative determination is made on the KL divergence equal to the threshold in S206. The KL divergence equal to the threshold may be handled differently. A positive determination may be made on the KL divergence equal to the threshold in S206.

Further, in the example of FIG. 9, one word line is selected in S203. Two or more word lines may be selected in S203. After selecting two or more word lines in S203, the manager 115 performs the operations in S204 to S206 for each selected word line. After making a positive determination on all the selected word lines in S206, the manager 115 performs the operation in S207. After making a negative determination on any of the selected word lines in S206, the manager 115 performs the operation in S208.

In S203, the manager 115 may select the number of word lines set according to the confidence interval or all the word lines in the block 300.

According to the embodiment, thus, the controller 102 obtains the Vth distribution from each of the two blocks 300 in unit of a word line, to find the KL divergence being the divergence quantity between the obtained Vth distributions. The controller 102 detects non-normalcy in the two blocks 300 from the KL divergence, if any.

Thereby, the controller 102 can detect a defective word line before accessing the word line in response to an access request from the host 2. This makes it possible to prevent the memory system 1 from deteriorating in responsiveness, which would otherwise occur due to the access to the defective word line.

Further, it becomes possible to detect defect in the word line without FA analysis, which is for the supplier of the memory system 1 or the NAND memory 101 to conduct.

According to the embodiment, the controller 102 sorts the storage areas into one or more groups, e.g., the block groups 310, according to the degree of wear-out, and selects two storage areas from the one or more groups.

The Vth distribution differs depending on the degree of wear-out. As configured above, the controller 102 selects two blocks 300 having similar degrees of wear-out. This enables accurate detection of a defect by eliminating the influence of the difference in the Vth distributions due to the degree of wear-out.

The operations of selecting two blocks 300 having similar degrees of wear-out are not limited to the operations above. The controller 102 may compute the degree of wear-out of each block 300 and select two blocks 300 having similar degrees of wear-out on the basis of the degrees of wear-out for the blocks 300. That is, the controller 102 may select the two blocks 300 according to the degree of wear-out without grouping the blocks.

The controller 102 may perform wear leveling control over the blocks 300, for example, so that the degrees of wear-out of all the blocks 300 can approach the same degree. In such a case the controller 102 can find two blocks 300 having similar degrees of wear-out by selecting any two blocks 300. Thus, the controller 102 may select two blocks 300 from all the blocks 300 except for the defective block or blocks.

Two or more logical blocks each including two or more physical blocks 300 may be set. Access including the erase operation may be executed in units of a logical block. In such a case, the blocks 300 constituting one logical block have the same usage history including the number of program erase cycles. That is, the blocks 300 constituting one logical block is considered to exhibit the same degree of wear-out. In such a case, the controller 102 may select one logical block, and select two blocks 300 from the blocks 300 of the selected logical block.

Further, according to the embodiment, when the KL divergence is smaller than the threshold, the controller 102 refrains from registering either of the two blocks 300 as a defective block, and thus refrains from prohibiting the use of either of the two blocks 300. With the KL divergence larger than the threshold, the controller 102 registers both of the two blocks 300 as the defective blocks, and thus prohibits the use of both of the two blocks 300.

That is, the controller 102 prohibits the use of both of the two blocks 300 after inferring a defect in one of the two blocks 300. This operation results in facilitating the inferring process, enabling detection of non-normalcy at higher speed.

First Modification

In the embodiment above, after inferring a defect in one of the two blocks 300, the controller 102 prohibits the use of both of the two blocks 300. In a first modification, the controller 102 identifies a block 300 including a defective word line from the two blocks 300, and registers the identified block 300 as a defective block. The other block 300 of the two blocks 300 is not registered as a defective block.

Hereinafter, the first modification of the embodiment will be described. The same processes or operations as those of the embodiment will be briefly described or omitted.

Figure 10:
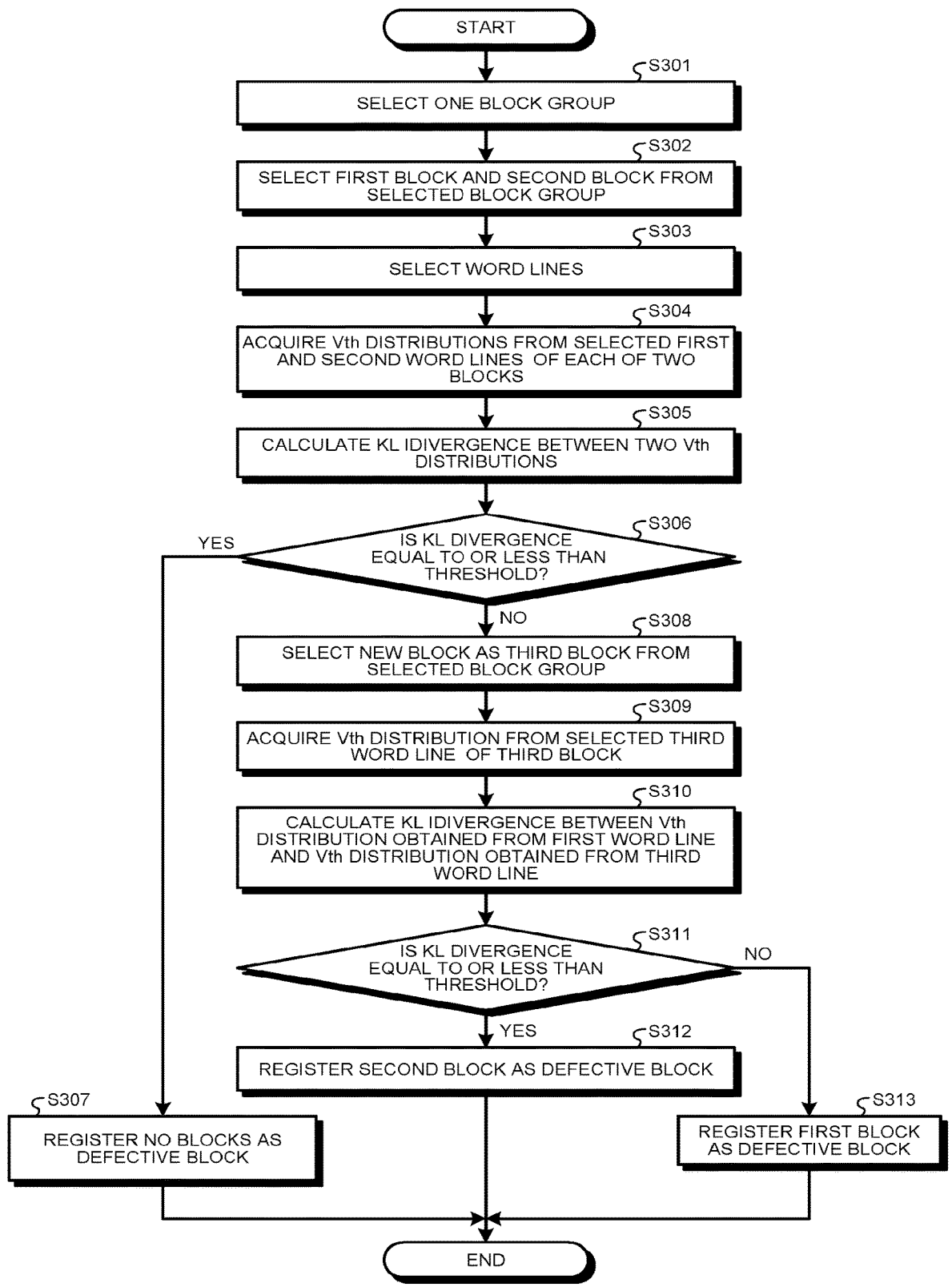
FIG. 10 is a flowchart illustrating an exemplary detecting operation to a block including a defective word line according to a first modification of an embodiment.

FIG. 10 is a flowchart illustrating an exemplary operation of detecting a block 300 including a defective word line according to the first modification of the embodiment.

In S301 to S307, the same processes as S201 to S207 in FIG. 9 are executed.

After determining that a KL divergence between a Vth distribution obtained from a first word line and a Vth distribution obtained from a second word line is more than a threshold (No in S306), the controller 102 selects, from the block group 310 selected in S301, a new block 300 (referred to as a third block 300) different from both the first block 300 and the second block 300 (S308).

Subsequently, the Vth-distribution acquirer 113 acquires a Vth distribution of a third word line indicated by the word line number of the third block 300 selected in S303 (S309).

The divergence-quantity calculator 114 computes a KL divergence between the Vth distribution obtained from the first word line and the Vth distribution obtained from the third word line (S310).

The manager 115 determines whether or not the KL divergence found in S310 is equal to or less than a given threshold (S311). The threshold used in S311 may be equal to the threshold used in S306 or S206.

From the KL divergence equal to or less than the threshold (Yes in S311), no defect in the first word line nor the third word line can be inferred. It has been found from a result of the determination in S306 that either the first word line or the second word line is defective. It can be known from the two results of determination that not the first word line and the third word line but the second word line is defective. Thus, with the KL divergence being equal to or less than the threshold (Yes in S311), the manager 115 refrains from registering the first block 300 but registers the second block 300 as a defective block (S312). This completes the operation of detecting the block including a defective word line.

From the KL divergence being more than the threshold (No in S311), defect in either the first word line or the third word line is inferred.

Typically, the word lines do not frequently fail. Thus, it is considered to be extremely rare that two or more of the first to third word lines in different blocks 300 fail at the same time. A defect in only one of the first to third word lines is thus assumable. It can be inferred from the results of the determinations in S306 and S311 that the first word line is defective.

With the KL divergence being more than the threshold (No in S311), the manager 115 registers the first block 300 but refrains from registering the second block 300 as a defective block (S313). This completes the operation of detecting the block including a defective word line.

In the example illustrated in FIG. 10, the manager 105 makes a negative determination as to the KL divergence matching the threshold in S311. The handling of the KL divergence matching the threshold is not limited thereto. A positive determination may be made on the KL divergence matching the threshold in S311.

As in the example of the embodiment, two or more word lines, the number of word lines set according to the confidence interval, or all the word lines in the block 300 may be selected in S303. After selecting two or more word lines in S303, the manager 115 executes the operations for each selected word line in S304 to S306. After making a positive determination as to the selected word lines in S306, the manager 115 executes the operation in S307.

After making a negative determination as to any of the selected word lines in S306, the manager 115 proceeds to S308. The manager 115 may execute the series of processes after S308 to only the word lines as negatively determined in S306 or two or more word lines. To execute the processes to two or more word lines, the manager 115 may select the number of word lines set according to the confidence interval including the word lines as negatively determined in S306, or all the word lines within the block 300.

As described above, according to the first modification, when the KL divergence between the Vth distributions obtained from the first word line and the second word line is larger than the threshold, the controller 102 selects the third block 300 in accordance with the degree of wear-out, and acquires the Vth distribution of the third word line of the third block 300. If the KL divergence between the Vth distributions acquired from the first word line and acquired from the third word line is larger than the threshold, the controller 102 registers the first block 300 as a defective block. If the KL divergence between the Vth distributions acquired from the first word line and acquired from the third word line is smaller than the threshold, the controller 102 registers the second block 300 as a defective block.

As a result, it is possible to prevent the block 300 including no defective word line from being registered as a defective block.

Second Modification

In a typical read sequence, data is read by a read operation and read data is subjected to error correction. In the case of occurrence of a failure of the error correction, data is read by a shift read once or more while the determination voltage is shifted, and read data by the shift read is subjected to error correction again. With a failure of the error correction after the shift read, for example, data is read by a distribution read to find a Vth distribution and change the determination voltage to an appropriate value according to the Vth distribution, and data is read by a shift read at the determination voltage after the change.

The manager 115 may detect a block including a defective word line, triggered by a failure of error correction to data read by a read operation. The read operation may be, for example, performed in response to a read request from the host 2 or a read request due to internal processing, such as garbage collection, of the memory system 1.

Alternatively, the manager 115 may detect a block including a defective word line in response to a failure of error correction, which triggers the acquisition of the Vth distribution, in the read sequence. As a result, the acquired Vth distributions can be used in both detecting the block including a defective word line and varying the determination voltage.

Hereinafter, the second modification of the embodiment will be described. The same processes or operations as those of the embodiment will be briefly described or omitted.

Figure 11:
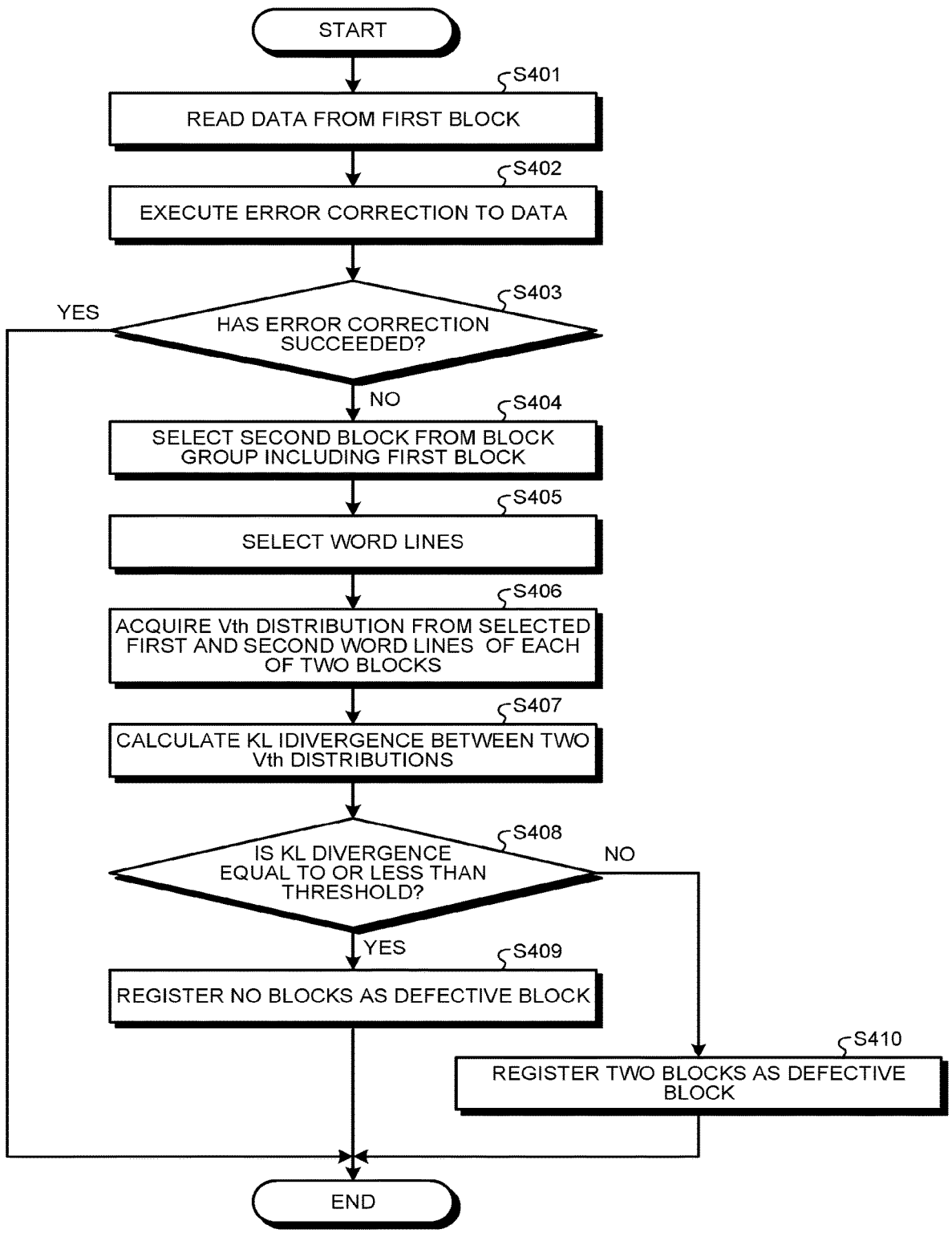
FIG. 11 is a flowchart illustrating an exemplary series of processes related to a read operation according to a second modification of an embodiment.

FIG. 11 is a flowchart illustrating an exemplary series of processes related to the read operation according to the second modification of the embodiment. As an example, a series of processes in the read operation in response to a read request from the host 2 will be described.

The access unit 111 reads data from a certain block 300 (referred to as a first block) in response to a read request from the host 2 (S401). The error corrector 112 executes error correction to the read data (S402). In response to a success of the error correction (Yes in S403) the manager 15 does not start detecting a block including a defective word line, completing the series of processes related to the read operation.

In response to a failure of the error correction (No in S403), the manager 114 selects the second block 300 from the block group 310 including the first block (S404). Through S405 to S410, the same processes as S203 to S208 in FIG. 9 are executed, completing the series of processes related to the read operation.

As described in the embodiment, the error corrector 112 may encode data by two or more methods having different error correction capabilities. In S403, the manager 115 may determine a success or a failure of the error correction by a given one of the two or more methods. In S403, for example, the manager 115 may determine a success or a failure of the error correction by the method with the lowest error correcting capability, by the method with the highest error correcting capability, or by the method with the intermediate error correcting capability.

In response to a failure of the error correction (No in S403), the operations of S303 to S313 described with reference to FIG. 10 may be executed, as in the first modification.

In S405, the manager 115 may select the numbers of the word lines through which the data is read in S401. Alternatively, the manager 115 may select the number of word lines set according to the confidence interval, including the word lines concerned in S401, or all the word lines included in the first block 300 and the second block 300.

In S408, after determining that the KL divergence is more than the threshold (No in S409), the manager 115 may register the first block and refrain from registering the second block as a defective block. This is because the manager 115 starts detecting a block including a defective word line in response to a failure of the read operation to the first block.

Thus, the controller 102 may start detecting a block including a defective word line, triggered by a failure of the error correction.

Third Modification

A controller 102 may select n-pairs of blocks 300 to sequentially detect a block including a defective word line from each of the selected n-pairs.

Figure 12:
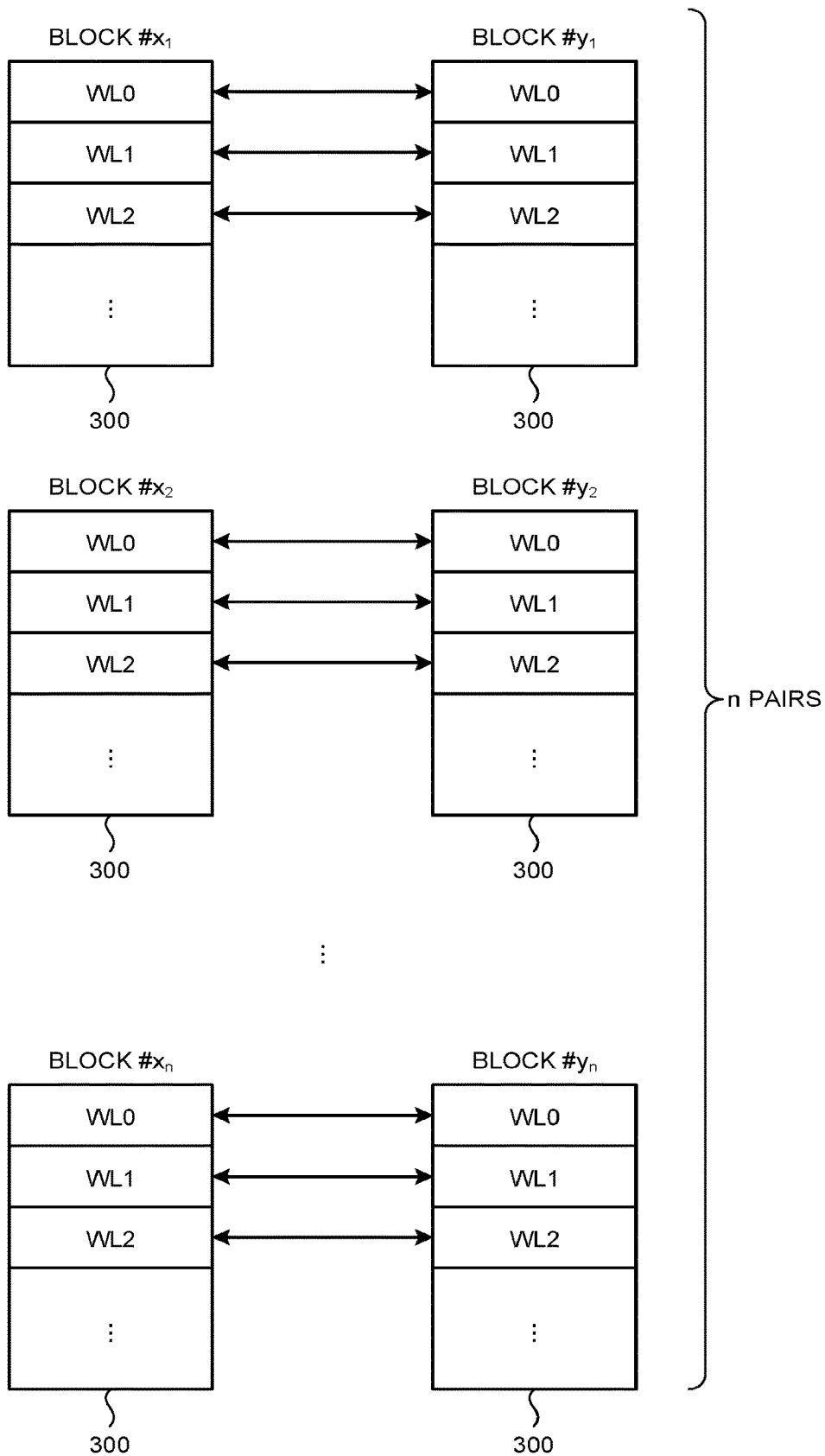
FIG. 12 is a diagram illustrating an exemplary selecting method of a pair of blocks according to a third modification of the embodiment.

As illustrated in FIG. 12, for example, the manager 115 randomly selects n-pairs of blocks 300. Each pair of two blocks 300 is considered to have similar degrees of wear-out. For example, the manager 115 may select one pair of blocks 300 from the same block group 310.

Alternatively, under wear leveling control over all the blocks 300 to allow their degrees of wear-out to approach the same degree, for example, the manager 115 may select one pair of blocks 300 from all the blocks 300 except for the block 300 registered as a defective block. At this time, the manager 115 may select the two blocks 300 by a predefined algorithm.

After n-pairs are set, the controller 102 determines defect or no defect in all the word lines in the two blocks 300 of each pair from the KL divergence between Vth distributions.

An algorithm for selecting a pair of blocks 300 can be, for example, forming one pair of a block #x and a block #(x+n+1). The manager 115 selects two blocks 300 for each of the n-pairs by sequentially substituting integers from j to (j+n−1) into x where j is a natural number.

Another algorithm for selecting a pair of two blocks 300 can be forming one pair of block #x and block #(x+k*n+1) where k is a natural number. The manager 115 selects two blocks 300 for each of the n-pairs by sequentially substituting integers from j to (j+n−1) into x.

Still another algorithm for selecting one pair of two blocks 300 can be forming one pair of block #x and block #f(x) where f(x) is a function of x. The manager 115 selects two blocks 300 for each of n-pairs by sequentially substituting integers from j to (j+n−1) into x.

In this manner, the controller 102 sets the number n according to the confidence interval and selects the n-pairs from the blocks 300.

Thereby, the controller 102 can accurately detect the block 300 including a defective word line from all the blocks 300.

The third modification can be applied in combination with the first modification.

Fourth Modification

Numerical information for use as a divergence quantity between two Vth distributions is not limited to the KL divergence. For example, divergence quantity D (P∥Q) may be defined by the following Equation (4):

$$D(P\|Q) = \sum_x P(x)\tanh\frac{|P(x) - Q(x)|}{2} \qquad (4)$$

According to Equation (4), when P(X)=Q(X) holds, D(P∥Q)=0 holds, so that, the quantity defined by Equation (4) may be adopted as a divergence quantity, instead of the KL divergence.

Alternatively, divergence quantity D(P∥Q) may be defined by the following Equation (5):

$$D(P\|Q) = \sum_x g(|P(x) - Q(x)|)h(|P(x) - Q(x)|) \qquad (5)$$

where g(x) and h(x) both are optional monotonically increasing functions with respect to x and satisfying the equation g(0)=h(0)=0.

Divergence quantity D(P∥Q) defined by Equation (5) satisfies an axiom of distance. Divergence quantity D(P∥Q) is not limited to the quantity defined by Equation (5), and the divergence quantity can be any quantity as long as it satisfies the axiom of distance.

The fourth modification may be used in combination with any of the first to third modifications.

Fifth Modification

The above embodiment and modifications have described the example that the degree of wear-out is computed from the number of program erase cycles, the number of the read operation, and the data retention time. The method of computation of the degree of wear-out is not limited thereto.

For example, the manager 115 may regard the number of program erase cycles as the degree of wear-out.

Alternatively, the manager 115 may compute the degree of wear-out from the number of program erase cycles and the number of the read operation. For example, the manager 115 computes the weighted addition of the number of program erase cycles and the number of the read operation, and regards the value found by the computation as the degree of wear-out of a target block.

The computation of the degree of wear-out may include various calculations such as multiplication, division, and subtraction, in addition to the weighted addition.

The embodiment and the first to fifth modifications have described the example of acquiring the Vth distribution in units of a word line. However, the Vth distribution may be acquired in units of a storage area smaller or larger than the word line.

In addition, after detecting a word line that may have a defect through comparison between Vth distributions, the controller 102 registers the block 300 including the word line as a defective block, i.e., a non-normal block unsuitable for use, and prohibits use of the block 300 and permits use of the blocks 300 other than defective block. However, the unit of usage permission/prohibition is not limited to the block 300. The unit of usage permission/prohibition may be set to a storage area smaller or larger than the block 300.

The unit of acquisition of the Vth distribution and the unit of non-normalcy detection may be the same or different.

Thus, according to the embodiment and the first to fifth modifications, the NAND storage 110 being a non-volatile memory includes a plurality of storage areas. Each of the storage areas includes a plurality of memory cells to which threshold voltages are set according to data. The controller acquires a first threshold voltage distribution of the memory cells in a first storage area of the storage areas, and acquires a second threshold voltage distribution of the memory cells in a second storage area of the storage areas. The controller detects non-normalcy in the first storage area or the second storage area from a divergence quantity between the first threshold voltage distribution and the first threshold voltage distribution.

Thereby, the controller can detect a defective word line before this word line is accessed in response to an access request from the host 2. Thus, the memory system 1 can be prevented from lowering in responsiveness, which would otherwise occur due to the access to the defective word line.

Further, the defective word line becomes detectable without FA analysis, which is for the supplier of the memory system 1 or the NAND memory 101 to conduct.

APPENDIX 1

A memory system includes a non-volatile memory including a plurality of storage areas, each of which includes a plurality of memory cells to which threshold voltages are set in accordance with data; and a controller that acquires a first threshold voltage distribution of the memory cells in a first storage area of the storage areas, that acquires a second threshold voltage distribution of the memory cells in a second storage area of the storage areas, and that detects non-normalcy in the first storage area or the second storage area from a first divergence quantity between the first threshold voltage distribution and the second threshold voltage distribution.

APPENDIX 2

In the memory system according to appendix 1, the controller selects n-pairs of first storage areas and second storage areas from the plurality of storage areas. The number n is set by the following Equation 6:

$$n = -\frac{\ln(1 - L_c)}{p}$$

where p represents an allowable maximum value of the first divergence quantity, and Lc represents a confidence interval.

APPENDIX 3

In the memory system according to appendix 1, the first divergence quantity serves as a Kullback-Leibler divergence.

APPENDIX 4

In the memory system according to appendix 1, the controller computes the first divergence quantity D(P∥Q) by the following Equation 7:

$$D(P\|Q) = \sum_x g(|P(x) - Q(x)|) h(|P(x) - Q(x)|)$$

where g(x) an x represent an optional monotonically increasing function with respect to x and satisfying the equation g(0)=h(0)=0, P(X) represents the first threshold voltage distribution, and Q(X) represents the second threshold voltage distribution.

APPENDIX 5

In the memory system according to appendix 1, the first storage area and the second storage area have similar degrees of wear-out.

While certain embodiments have been described, these embodiments have been presented by way of example only, and are not intended to limit the scope of the inventions. Indeed, the novel methods and systems described herein may be embodied in different other forms; furthermore, various omissions, substitutions and varies in the form of the methods and systems described herein may be made without departing from the spirit of the inventions. The accompanying claims and their equivalents are intended to cover such forms or modifications as would fall within the scope and spirit of the inventions.

What is claimed is:

1. A memory system, comprising:
a non-volatile memory including a plurality of storage areas, each of which includes a plurality of memory cells to which threshold voltages are set in accordance with data, each of the storage areas being a block which is a unit of erase; and
a controller configured to:
acquire a first threshold voltage distribution of memory cells in a first storage area of the plurality of storage areas,
acquire a second threshold voltage distribution of memory cells in a second storage area of the plurality of storage areas, the second storage area being a different storage area than the first storage area, and
detect non-normalcy in the first storage area or the second storage area from a first divergence quantity between the first threshold voltage distribution and the second threshold voltage distribution.

2. The memory system according to claim 1, wherein the controller is configured to select the first storage area and the second storage area in accordance with a degree of wear-out of each of the plurality of storage areas.

3. The memory system according to claim 2, wherein the controller is configured to sort the plurality of storage areas into one or more groups in accordance with the degree of wear-out thereof, and to select the first storage area and the second storage area from one of the one or more groups.

4. The memory system according to claim 2, wherein the controller is configured to:
refrain from prohibiting use of the first storage area and the second storage area when the first divergence quantity is smaller than a threshold,
select a third storage area from the plurality of storage areas in accordance with the degree of wear-out to acquire a third threshold voltage distribution of the memory cells in the third storage area, when the first divergence quantity is larger than the threshold,
prohibit use of the first storage area when a second divergence quantity between the first threshold voltage distribution and the third distribution is larger than the threshold, and
prohibit use of the second storage area when the second divergence quantity is smaller than the threshold.

5. The memory system according to claim 2, wherein the controller is configured to compute the degree of wear-out from at least one of the number of program erase cycles, the number of read operations, and a data retention time.

6. The memory system according to claim 1, wherein the controller is configured to:
refrains from prohibiting use of the first storage area and the second storage area when the first divergence quantity is smaller than a threshold, and
prohibits the use of the first storage area and the second storage area when the first divergence quantity is larger than the threshold.

7. The memory system according to claim 1, wherein the controller is configured to execute a read operation to the first storage area, to execute an error correction to data read by the read operation, and to acquire the first threshold voltage distribution and the second threshold voltage distribution in response to a failure of the error correction.

8. The memory system according to claim 1, wherein the controller is configured to select n-pairs of the first storage area and the second storage area from the plurality of storage areas, and
the n is defined by the following Equation:

$$n = -\frac{\ln(1 - L_c)}{p}$$

where p represents a maximum allowable value of the first divergence quantity, and Lc represents a confidence interval.

9. The memory system according to claim 1, wherein the first divergence quantity represents a Kullback-Leibler divergence.

10. The memory system according to claim 1, wherein the controller is configured to compute, by the following Equation, D(P∥Q) as the first divergence quantity:

$$D(P\|Q) = \sum_{x} g(|P(x) - Q(x)|) h(|P(x) - Q(x)|)$$

where g(x) and h(x) represent an optional monotonically increasing function with respect to x and satisfying the equation g(0)=h(0)=0, P(x) represents the first threshold voltage distribution, and Q(x) represents the second threshold voltage distribution.

11. The memory system according to claim 1, wherein the first storage area and the second storage area are similar to each other in terms of the degree of wear-out.

12. A method of controlling a non-volatile memory including a plurality of storage areas, each of which includes a plurality of memory cells to which threshold voltages are set in accordance with data, each of the storage areas being a block which is a unit of erase, the method comprising:
acquiring a first threshold voltage distribution of memory cells in a first storage area of the plurality of storage areas; and
acquiring a second threshold voltage distribution of memory cells in a second storage area of the plurality of storage areas, the second storage area being a different storage area than the first storage area; and
detecting non-normalcy in the first storage area or the second storage area from a first divergence quantity between the first threshold voltage distribution and the second threshold voltage distribution.

13. The method according to claim 12, further comprising:
selecting the first storage area and the second storage area in accordance with a degree of wear-out of each of the plurality of storage areas.

14. The method according to claim 13, wherein the selecting comprises sorting the plurality of storage areas into one or more groups in accordance with the degree of wear-out thereof, and selecting the first storage area and the second storage area from one of the one or more groups.

15. The method according to claim 13, further comprising:
refraining from prohibiting use of the first storage area and the second storage area when the first divergence quantity is smaller than a threshold;
selecting a third storage area from the plurality of storage areas in accordance with the degree of wear-out to acquire a third threshold voltage distribution of the memory cells in the third storage area, when the first divergence quantity is larger than the threshold value;

prohibiting use of the first storage area when a second divergence quantity of the first threshold voltage distribution and the third threshold voltage distribution is larger than the threshold; and prohibiting use of the second storage area when the second divergence quantity is smaller than the threshold.

16. The method according to claim 13, further comprising:

computing the degree of wear-out from at least one of the number of program erase cycles, the number of read operations, and a data retention time.

17. The method according to claim 12, further comprising:

refraining from prohibiting use of the first storage area and the second storage area when the first divergence quantity is smaller than a threshold; and prohibiting the use of the first storage area and the second storage area when the first divergence quantity is larger than the threshold.

18. The method according to claim 12, further comprising:

executing a read operation to the first storage area;

executing an error correction to data read by the read operation; and acquiring the first threshold voltage distribution and the second threshold voltage distribution in response to a failure of the error correction.

19. The method according to claim 12, further comprising:

selecting n-pairs of the first storage area and the second storage area from the plurality of storage areas, wherein the n is defined by the following Equation:

$$n = -\frac{\ln(1 - L_c)}{p}$$

where p represents a maximum allowable value of the first divergence quantity, and Lc represents a confidence interval.

20. The memory system according to claim 12, wherein the first divergence quantity represents a Kullback-Leibler divergence.

* * * * *